(12) United States Patent
Kohout et al.

(10) Patent No.: US 7,479,770 B2
(45) Date of Patent: Jan. 20, 2009

(54) SYSTEM AND METHOD FOR DRIVING A POWER FIELD-EFFECT TRANSISTOR (FET)

(75) Inventors: James Allen Kohout, Dallas, TX (US); David John Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 388 days.

(21) Appl. No.: 11/116,835

(22) Filed: Apr. 28, 2005

(65) Prior Publication Data

US 2006/0244498 A1    Nov. 2, 2006

(51) Int. Cl.
G05F 1/40 (2006.01)
H03K 17/16 (2006.01)

(52) U.S. Cl. .................. 323/271; 327/381

(58) Field of Classification Search .......... 323/265, 323/268, 271, 273–277, 282, 284, 285; 327/378–389, 327/399, 423, 424, 427, 434, 494
See application file for complete search history.

(56) References Cited

U.S. PATENT DOCUMENTS 5,023,678 A    6/1991   Kinzer
6,271,709 B1 * 8/2001  Kimura et al. ............ 327/380
6,650,100 B1   11/2003  Kohout et al.
6,677,738 B1   1/2004   Hesse
6,781,422 B1   8/2004   Yang
6,788,038 B1   9/2004   Bell et al.
6,859,087 B2 * 2/2005   Galli et al. ................ 327/423
6,903,597 B2 * 6/2005   Tai ............................. 327/434
6,967,519 B2 * 11/2005  Nakayama et al. ........ 327/380

* cited by examiner

Primary Examiner—Matthew V Nguyen
(74) Attorney, Agent, or Firm—William B. Kempler; W. James Brady, III; Frederick J. Telecky, Jr.

(57) ABSTRACT

A system and method is provided for driving a power field-effect transistor (FET). In one embodiment, a system comprises a control circuit that generates a control signal to provide a gate voltage of the power FET. The system further comprises a slope control circuit coupled between the control circuit and the power FET that is operative to dynamically control the rate-of-change of a gate voltage of the power FET to reduce electromagnetic interference (EMI) emissions and power loss resulting from switching the power FET.

18 Claims, 7 Drawing Sheets

SYSTEM AND METHOD FOR DRIVING A POWER FIELD-EFFECT TRANSISTOR (FET)

TECHNICAL FIELD

This invention relates to electronic circuits, and more specifically to a system and method for driving a power field-effect transistor (FET).

BACKGROUND

There is an ever increasing demand for power conversion and regulation circuitry to operate with increased efficiency and reduced power to accommodate the continuous reduction in size of electronic portable devices. Many times these devices are battery powered, and it is desirable to utilize as little power as possible to operate these devices so that the battery life is extended. Switching regulators have been implemented as an efficient mechanism for providing a regulated output in power supplies. One such type of regulator is known as a switching regulator or switching power supply, which controls the flow of power to a load by controlling the on and off duty-cycle of one or more high-side switches coupled to the load. Many different classes of switching regulators exist today.

One type of switching regulator is known as a synchronous switching regulator. In a synchronous switching regulator, an inductor is used to maintain current flow that is switched from two separate sources. The two sources can include a high-side switch, such as a high-side field-effect transistor (FET), and a low-side switch, such as a low-side FET and a freewheeling diode. Once the high-side FET is turned off, magnetic power stored in the inductor dissipates to force current through the inductor by changing the voltage of the inductor source node to negative relative to ground. The freewheeling diode thus conducts current from ground to the inductor after the high-side has been turned off and before the low-side FET has been turned on. In this way, current continuously flows through the inductor in the times between activation of the high-side and the low-side switches.

Switching regulator circuit designers need to be conscientious of electromagnetic interference (EMI) emissions that result from current flow within a given switching regulator circuit. One source of EMI emissions in a switching regulator results from the rapid changes in input current (di/dt) as the power FET is activated and the rapid decay of current as the power FET is deactivated. When the gate voltage of a power FET reaches its threshold voltage, current flows through the power FET and can create EMI emissions. When the gate voltage of the power FET increases rapidly above the threshold voltage, the EMI emissions resulting from the rapid changes in input current flow through the FET are often too large in magnitude to meet acceptable design criteria. A solution to this problem of unacceptable EMI emissions is to slow the increase of the gate voltage of the power FET, such as by adding capacitance to the gate relative to the source of the power FET. This results in a slower increase of input current, and thus reduces the EMI emissions from the switching regulator.

Figure 1:
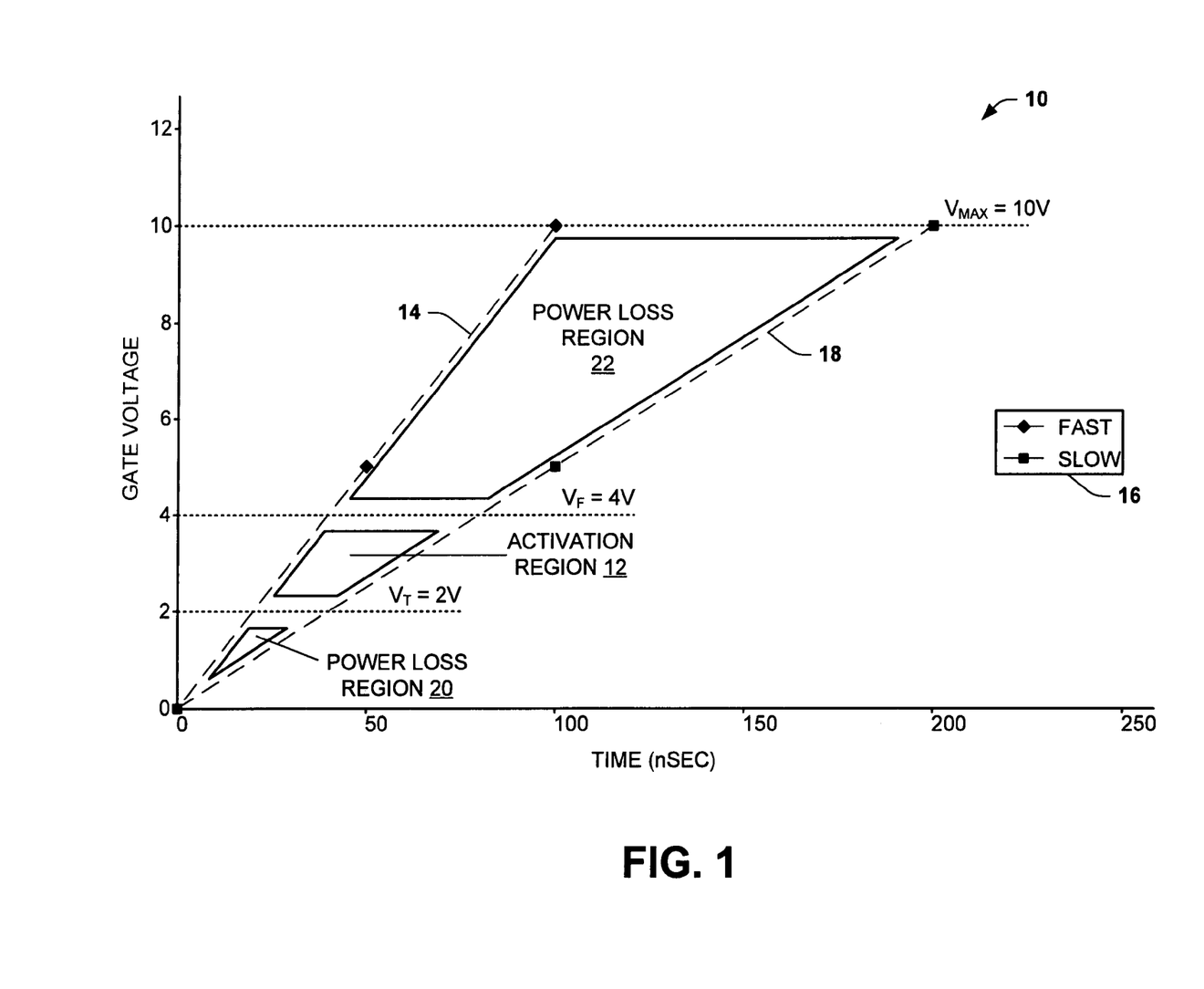
FIG. 1 illustrates a graph of gate voltage over time for a power field effect transistor (FET).

FIG. 1 depicts a graph 10 of time versus voltage demonstrating a relative rate-of-increase of a gate voltage of a power FET in a switching regulator. The power FET to which the graph 10 models has a threshold voltage $V_T$ (depicted as about 2 volts in the example of FIG. 1) at which the power FET begins to activate. It is at this point in which current begins to flow from the drain to the source of the power FET. The range of voltage from the threshold voltage $V_T$ to a voltage $V_F$ at which the power FET is fully activated (about 4 volts in the example of FIG. 1) is depicted as an activation region 12.

A dashed line 14 (denoted "fast" in a legend 16 of the graph 10) represents a more rapid rate-of-increase (i.e., greater slope) of the gate voltage of the power FET. As the gate voltage increases at a rapid rate, the rate of change of input current flowing through the power FET will be very high, resulting in unacceptable levels of EMI emissions. A dashed line 18 (denoted "slow" in the legend 16 of the graph 10) represents a slower rate-of-increase (i.e., smaller slope) of the gate voltage of the power FET. As the gate voltage increases at a slower rate, the rate of change of the input current flowing through the power FET will be smaller, resulting in acceptable levels of EMI emissions.

A different problem, however, results from the slower increase of the gate voltage represented by the dashed line 18. Because the gate voltage corresponding to the dashed line 18 increases at a slower rate, it takes a longer period of time for the gate voltage to reach the threshold voltage $V_T$. In the above example of the synchronous switching regulator, this means that the freewheeling diode is conducting current through the inductor for a longer period of time than if the gate voltage was increased at the faster rate. Because the magnetic field of the inductor collapses to maintain the freewheeling diode current while the power FET is off, the switching regulator experiences a loss of power while the freewheeling diode is conducting current. Thus, the dashed line 18 has a corresponding power loss below the activation region 12 that is greater than the dashed line 14. This loss of power of the switching regulator is represented in the graph 10 by a power loss region 20.

In addition to the power loss represented by the power loss region 20, the switching regulator also loses power after the power FET has become fully activated (i.e., conductive loss). While the gate voltage is increasing from the fully activated voltage $V_F$ to a maximum voltage $V_{MAX}$ (depicted as 10 volts in the example of FIG. 1), the power FET acts as a variable resistor between the drain and the source. At lower voltage levels greater than the fully activated voltage $V_F$, the drain-to-source resistance $R_{DSon}$ of the power FET is greater than it is at the maximum voltage $V_{MAX}$. Thus, the total amount of resistance over time (dr/dt) is inversely proportional to the amount of time it takes for the gate voltage to reach the gate maximum voltage $V_{MAX}$. For example, the dashed line 14 experiences a smaller $R_{DSon}$ over time than the dashed line 18. Since resistive loads generate power loss in the form of heat, the dashed line 18 has a corresponding power loss that is greater than the dashed line 14 above the fully activated voltage $V_F$. This loss of power is represented in the graph 10 by a power loss region 22.

The graph 10 of FIG. 1 thus demonstrates two separate ways in which to activate a power FET in a switching regulator. One way is to increase the gate voltage of the power FET rapidly, resulting in unacceptable levels of EMI emissions. The other way is to increase the gate voltage of the power FET slowly, resulting in undesired power loss. Thus, the two ways of activating a power FET in a switching regulator are subject to competing design constraints.

SUMMARY

One embodiment of the present invention may include a system for driving a power FET. The system comprises a control circuit that generates a control signal to provide a gate voltage of the power FET. The system further comprises a slope control circuit coupled between the control circuit and the power FET that is operative to dynamically control a rate-of-change of a gate voltage of the power FET to reduce electro-magnetic interference (EMI) emissions and power loss resulting from switching the power FET.

Another embodiment of the present invention may include a method for driving a power FET comprising asserting a gate voltage of the power FET at a first rate-of-increase and monitoring the gate voltage of the power FET. The method also comprises reducing the first rate-of-increase of the gate voltage of the power FET to a second rate-of-increase upon the gate voltage reaching a threshold voltage of the power FET. The method further comprises increasing the second rate-of-increase of the gate voltage of the power FET to a third rate-of-increase upon the power FET becoming substantially fully activated.

Another embodiment of the present invention may include a method for driving a power FET comprising de-asserting a gate voltage of the power FET at a first rate-of-decrease, monitoring a source voltage of the power FET, and reducing the first rate-of-decrease of the gate voltage of the power FET to a second rate-of-decrease upon the power FET beginning to deactivate.

Another embodiment of the present invention may include a system for reducing power loss and EMI emissions resulting from driving a power FET comprising a means for measuring a gate voltage of the power FET. The system also comprises a means for dynamically adjusting the rate-of-change of the gate voltage of the power FET based on the measured gate voltage of the power FET.

DETAILED DESCRIPTION

The present invention relates to electronic circuits, and more specifically to the reduction of EMI emissions and power loss associated with switching a power FET. It is to be understood that, in view of the forgoing discussion, the terms "power loss" and "loss of power" refer to a reduction in efficiency, and are not to be construed as a loss of power supplied to the power FET, loss of current supplied from the power FET, or loss of power of the system that includes the power FET. To reduce the EMI emissions associated with switching on or switching off a power FET, a slope control circuit reduces the rate-of-change of the gate voltage of the power FET at the point at which the power FET begins to turn on or off. For example, if the drain-source current changes more slowly through the power FET due to a gradual increase of the gate voltage, EMI emissions are reduced during the power FET activation.

However, in order to avoid excessive power loss, the slope control circuit changes the gate voltage at a first rate while the gate voltage of the power FET is less than the threshold voltage, changes the gate voltage at a second rate between a threshold voltage and a substantially fully activated voltage, and changes the voltage to a third rate after the substantially fully activated voltage. The second rate is slower than the first rate and the third rate. This will result in a reduction of power loss resulting from current flow from ground through a low-side device, such as through a freewheeling diode, while the power FET is not activated since a high-side FET or a low-side FET will become activated quicker at the first rate. This will also result in reduced EMI emissions at the second rate since the change in input current will be reduced at the slower second rate. Additionally, the rapid increase of gate voltage after full activation of the power FET will result in a more rapid reduction of drain-to-source resistance $R_{Don}$, such that power loss resulting from heat will be reduced.

The examples that follow, in accordance with the present invention, are described with regard to the activation of a high-side FET. However, it is to be understood that the same principles and advantages follow with regard to the deactivation of a high-side FET, in accordance with the present invention. Additionally, as will be later demonstrated with regard to FIG. 4, it is also to be understood that the same principles and advantages follow with regard to the activation of a low-side FET, in accordance with an aspect of the invention.

Figure 2:
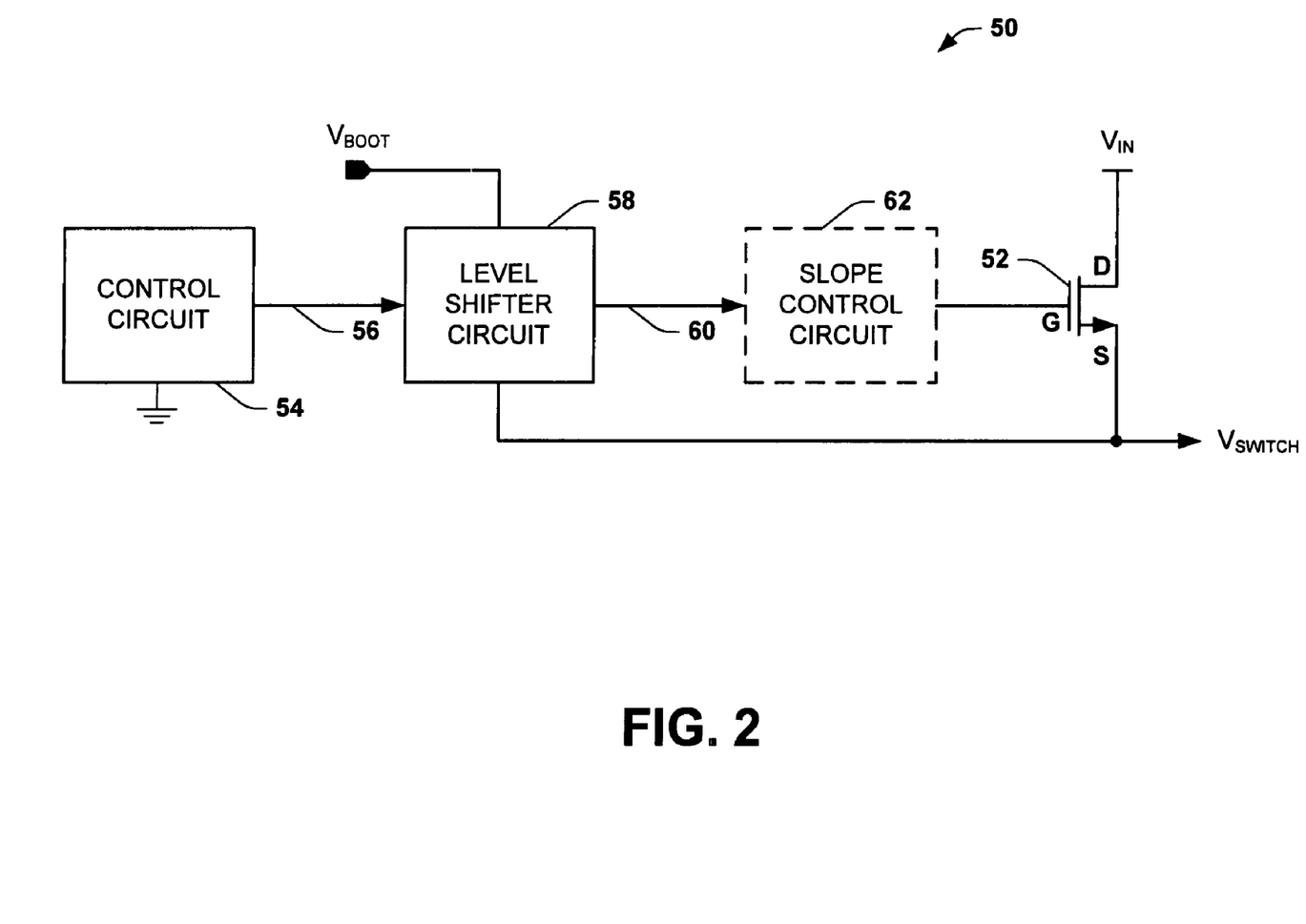
FIG. 2 illustrates a block diagram of a system incorporating a slope control circuit for driving a high-side FET in accordance with an aspect of the invention.

FIG. 2 illustrates a system 50 for activating a high-side FET 52 in accordance with an aspect of the invention. The high-side FET 52 is depicted in FIG. 2 as being an N-type MOSFET switch, but it is to be appreciated that a P-type MOSFET switch could also be used. When the high-side FET 52 is activated by asserting a signal (i.e., forcing a signal to a logic 1) at a gate terminal G, current will flow from the $V_{IN}$ node at a drain terminal D to the $V_{SWITCH}$ node at a source terminal S through the high-side FET 52. In the example of FIG. 2, a control circuit 54 generates a control signal 56, which could be a square wave. The control signal 56 generated by the control circuit 54 is typically referenced to ground, as denoted in FIG. 2, and the high-side FET 52 is typically used to drive an output of some active device, such as a motor or a switching regulator (not shown). Therefore, the system 50 includes a level shifter circuit 58 that adjusts the control signal 56 to a higher voltage reference level for proper activation of the high-side FET 52 referenced to $V_{SWITCH}$. In the example of FIG. 2, the level shifter circuit 58 receives an input signal $V_{BOOT}$, which could be a supply voltage that floats relative to $V_{SWITCH}$, and outputs an adjusted control signal 60 for activation of the high-side FET 52.

A square wave control signal, such as a clock signal or timing signal, typically has a very high slope (i.e., change in voltage over time (dv/dt)). When a typical square wave, such as the adjusted control signal 60, is applied to the high-side FET 52, the rapid increase of voltage at the gate terminal results in a rapid change in input current (di/dt) flowing through the high-side FET 52 from $V_{IN}$ to $V_{SWITCH}$ during activation of the high-side FET 52. It is this rapid change in input current that causes undesirable amounts of EMI emissions. As described previously, capacitance between the gate terminal G and the source terminal S of the high-side FET 52 is often added to overcome this problem. This reduces the slope of the square wave control signal, thus resulting in a smaller input current with lower EMI emissions. However, by reducing the slope of the control signal, EMI emissions are lowered at the cost of an increase in power loss, as described above.

The system 50 of FIG. 2 alleviates these conflicting design constraints by including a slope control circuit 62 between the level shifter circuit 58 and the high-side FET 52. At the time before the high-side FET 52 becomes activated, when the gate voltage of the high-side FET 52 has not yet reached a threshold voltage, the slope of the adjusted control signal 60 will be very high, thus reducing power loss that could be caused by a free-wheeling diode conducting current. The slope control circuit 62 dynamically adjusts the slope of the adjusted control signal 60 by reducing the slope of the adjusted control signal 60 during the time that the high-side FET 52 is becoming activated, thus reducing EMI emissions caused by a rapid change in input current. Also, at the time after the high-side FET 52 has become fully activated, when the FET has switched from a saturation region to a linear region and the full amount of drain-source current is flowing, the slope of the adjusted control signal 60 will be very high, thus reducing conducted power loss resulting from heat caused by higher amounts of resistance $R_{DSon}$.

Figure 3:
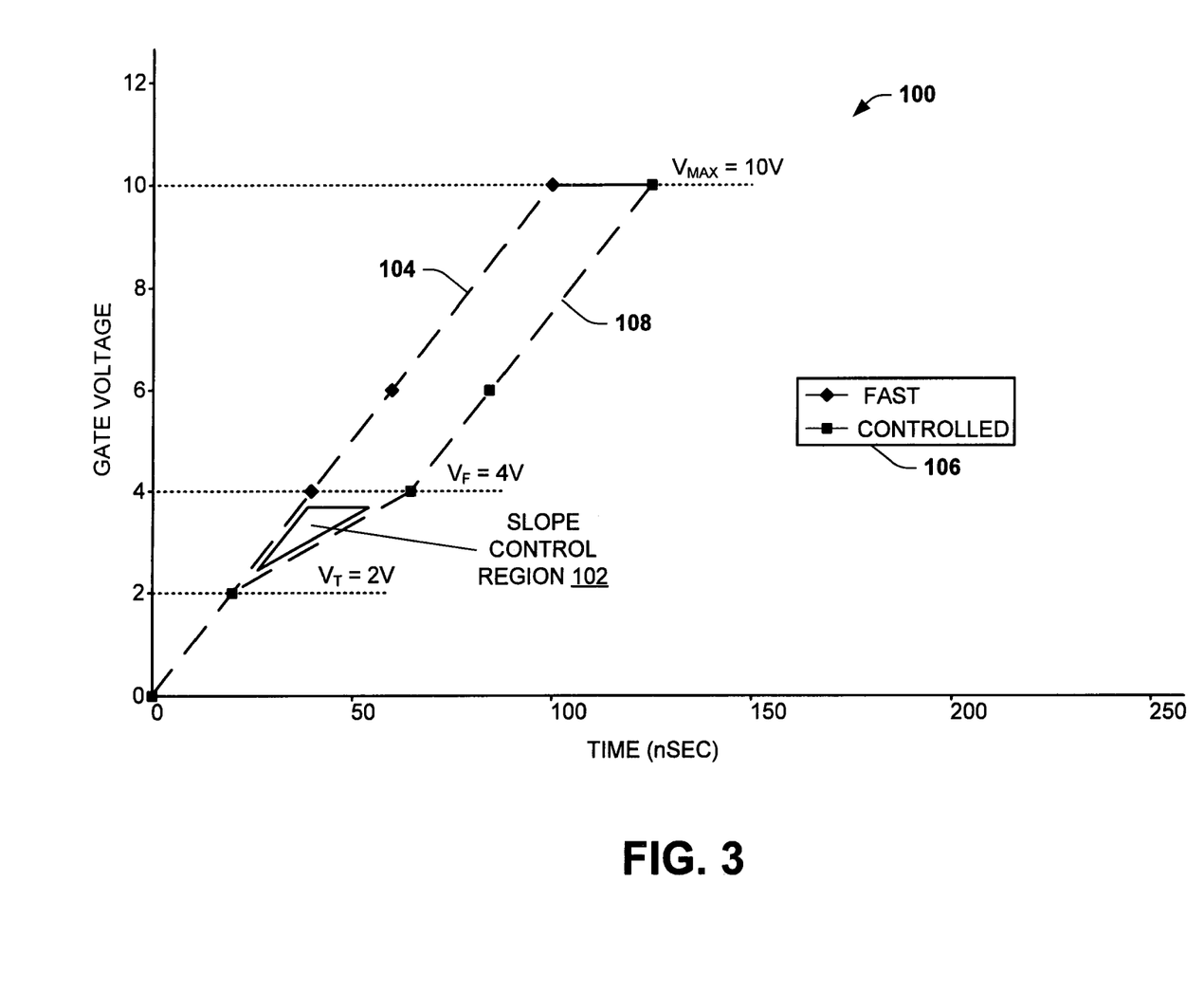
FIG. 3 illustrates another graph of gate voltage over time in accordance with an aspect of the invention.

FIG. 3 illustrates a graph 100 of time versus voltage demonstrating a relative rate-of-increase of a gate voltage of a high-side FET in accordance with an aspect of the invention. The high-side FET to which the graph 100 models has a threshold voltage $V_T$ (depicted as 2 volts in the example of FIG. 3) at which the gate voltage begins to activate the high-side FET. It is at this point in which current begins to flow from the drain to the source of the high-side FET. The range of voltage from the threshold voltage $V_T$ to a voltage $V_F$ at which the high-side FET is fully activated (about 4 volts in the example of FIG. 3) is depicted as a slope control region 102. In the above example of current flow from ground through a low-side device, such as through a freewheeling diode, the fully activated voltage $V_F$ can represent a point at which the output of the high-side FET becomes positive relative to ground. Thus, when the high-side FET becomes fully activated at the fully activated voltage $V_F$, the high-side FET begins to switch from the saturation region to the linear region, and thus the maximum amount of current begins flowing through the high-side FET, regardless of the amount of additional voltage that is applied to the gate. Also, it is to be understood that, in the example of FIG. 3, the high-side FET has a threshold voltage $V_T$ of about 2 volts and a fully activated voltage $V_F$ of about 4 volts. However, any type of FET can be used in accordance with the invention, and accordingly these values depend on the type of FET used for the high-side switch.

A dashed line 104 (denoted "fast" in a legend 106 of the graph 100) represents a more rapid rate-of-increase (i.e., greater slope) of the gate voltage of the high-side FET. As the gate voltage increases at a rapid rate through the slope control region 102, the input current flowing through high-side FET will be very high, resulting in unacceptable levels of EMI emissions. A dashed line 108 (denoted "controlled" in the legend 106 of the graph 100) represents a controlled rate-of-increase (i.e., controlled slope) of the gate voltage of the high-side FET. The controlled slope dashed line 108 represents a controlled slope rate-of-increase of the gate voltage, such as could be performed by the slope control system described above with reference to FIG. 2. The controlled slope rate-of-increase of the gate voltage alleviates the problem of unacceptable EMI emissions during activation of the high-side FET by reducing the slope of the gate voltage during the slope control region 102. In other words, in the time between the gate voltage being substantially equal to the threshold voltage $V_T$ and the fully activated voltage $V_F$, the rate-of-increase of the gate voltage is reduced. As the gate voltage increases at a slower rate, the input current rate-of-change through the high-side FET will be smaller, resulting in acceptable levels of EMI emissions.

It is to be understood that this control of the rate-of-change of the input current, in accordance with an aspect of the invention, can be adjusted to meet the requirements of a particular application. For instance, environmental factors of a given application could be a consideration for determining the slope of the controlled slope dashed line 108, as a smaller slope results in decreased EMI emissions at the expense of increased internal temperature of the high-side FET. For example, in environments that have a low ambient temperature, the controlled slope dashed line 108 could have a smaller slope for a more gradual increase in gate voltage and thus a more substantially reduced level of EMI emissions. However, in environments that have a higher ambient temperature, it may be necessary to have a greater slope for the controlled slope dashed line 108. An example of a reason for a greater slope for the controlled slope dashed line 108 is that there may be an equally compelling desire to control the internal temperature of the high-side FET as well as reduce EMI emissions, such that EMI emission reduction may be sacrificed to reduce the internal temperature of the high-side FET. Therefore, it may be possible to control the slope of the controlled slope dashed line 108 to depend from environmental factors such as temperature. For example, the slope control circuit 62 in the example of FIG. 2 may include a temperature sensor to determine environmental factors, such that the slope control circuit 62 can set a slope for the controlled slope dashed line 108 accordingly.

The high-side FET also loses power after the high-side FET has become fully activated. While the gate voltage is increasing from the fully activated voltage $V_F$ to a gate maximum voltage $V_{MAX}$ (depicted as 10 volts in the example of FIG. 3), the high-side FET acts as a variable resistor between the drain and the source. At lower voltage levels greater than the fully activated voltage $V_F$, the drain-to-source resistance $R_{DSon}$ of the high-side FET is greater than it is at the maximum voltage $V_{MAX}$. Thus, the total amount of resistance over time (dr/dt) is inversely proportional to the amount of time it takes for the gate voltage to reach the gate maximum voltage $V_{MAX}$. Since resistive loads generate power loss in the form of heat, it is desirable to increase the gate voltage as quickly as possible above the fully activated voltage $V_F$ to increase the negative dr/dt and subject the high-side FET to as little a resistance $R_{DSon}$ as possible. Accordingly, the slope control system, such as that described above with reference to FIG. 2, increases the rate-of-increase of the gate voltage after the high-side FET has become fully activated. This more rapid rate-of-increase results in a reduced power loss resulting from heat generated from high levels of resistance $R_{DSon}$. In this way, the dashed line 108 represents a more optimal activation of a high-side FET because it combines the advantages of the previous ways of activating a high-side FET described above with reference to FIG. 1. The dashed line 108 has the advantage of power loss reduction resulting from the dashed line 14 of FIG. 1 with the advantage of lower EMI emissions resulting from the dashed line 18 of FIG. 1.

In the example of FIG. 3, the dashed line 108 shows that the rate-of-increase of the gate voltage above the fully activated voltage $V_F$ has the same slope as the rate-of-increase below the threshold voltage $V_T$. However, it is to be understood that the two slopes need not be the same, and are merely illustrative of a more rapid rate-of-increase than the slope of the gate voltage in the slope control region 102 so as to represent reduced power loss. It is to be further understood that the slopes of the dashed line 108, as well as the voltages $V_T$, $V_F$, and Vs, could all vary depending on the type of high-side FET and the associated circuitry, such as the control circuit 54 and the level shifter circuit 58 of FIG. 2, used in accordance with an aspect of the invention.

It is to be understood that, in the example of FIG. 3, the slope control system can deactivate a high-side FET, such as the high-side FET 52 in the example of FIG. 2, in substantially the same way in which it was activated, in accordance with an aspect of the invention. For example, to reduce conductive losses associated with higher amounts of resistance $R_{DSon}$, the slope control system can rapidly decrease the gate voltage from the maximum voltage $V_{MAX}$ to the fully activated voltage $V_F$. In the time between the gate voltage being substantially equal to the fully activated voltage $V_F$ and the threshold voltage $V_T$, the slope control system reduces the rate-of-decrease of the gate voltage to avoid unacceptable levels of EMI emissions resulting from a rapid decrease in current.

Figure 4:
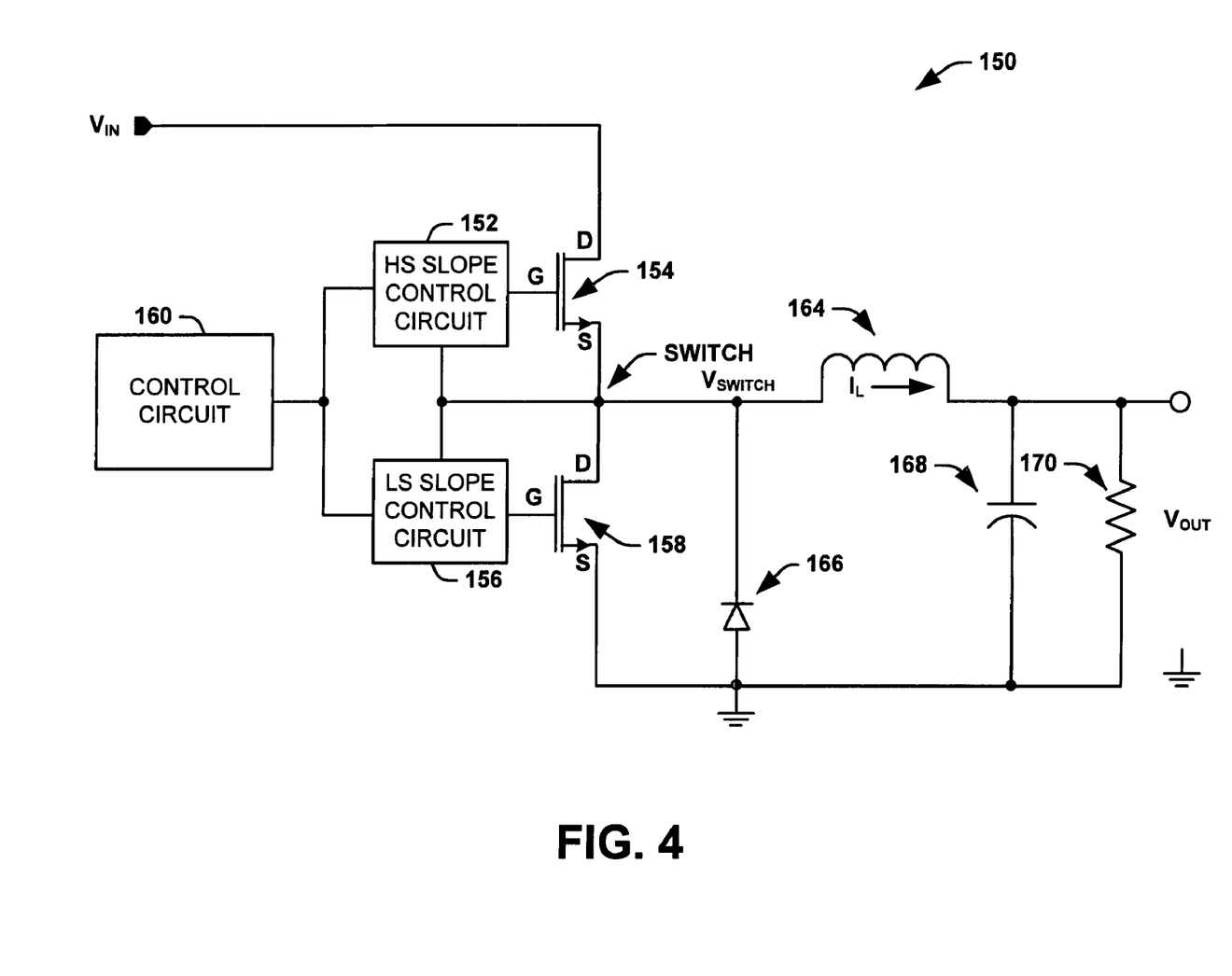
FIG. 4 illustrates a synchronous switching regulator incorporating slope control circuits for driving a high-side switch and a low-side switch in accordance with an aspect of the invention.

FIG. 4 illustrates a switching regulator 150 (e.g., a synchronous buck converter) that includes a high-side slope control circuit 152 for an N-type high-side FET 154 and a low-side slope control circuit 156 for an N-type low-side FET 158 in accordance with an aspect of the invention. The high-side slope control circuit 152 is connected to a gate terminal of the high-side FET 154 and is operative to control the rate-of-change of the gate voltage of the high-side FET 154. The low-side slope control circuit 156 is connected to a gate terminal of the low-side FET 158 and is operative to control the rate-of-change of the gate voltage of the low-side FET 158. The switching regulator 150 includes a control circuit 160 that is operative to control the duty cycle of pulses provided to both the high-side FET 154 through the high-side slope control circuit 152 and the low-side FET 158 through the low-side slope control circuit 156. The control circuit 160 provides a square wave switching signal, such as a clock signal or timing signal, to the slope control circuits 152 and 156.

The high-side FET 154 has a drain terminal that is connected to a voltage source $V_{IN}$, and the low-side FET 158 has a source terminal connected to ground. A source terminal of the high-side FET 154 and a drain terminal of the low-side FET 158 share a common node SWITCH, with a respective voltage $V_{SWITCH}$, that is also connected to the high-side slope control circuit 152 and the low-side slope control circuit 156. An inductor 164 is interconnected between the node SWITCH and an output terminal for the switching regulator 150, the output terminal having a voltage of $V_{OUT}$. A freewheeling diode 166 is interconnected between the node SWITCH and ground, with an anode connected to ground and a cathode connected to the node SWITCH.

When the control circuit 160 activates the high-side, the output of the high-side slope control circuit 152 goes high (e.g., logic 1), pulling the gate of the high-side FET 154 higher than the source and turning the high-side FET 154 on. When the high-side FET 154 is on, the source-to-drain input impedance will be low and $V_{SWITCH}$ will be approximately equal to $V_{IN}$. When $V_{SWITCH}$ is approximately equal to $V_{IN}$, an inductor current $I_L$ through the inductor 164 will begin to increase. The current $I_L$ continues to increase until $V_{SWITCH}$ changes.

The control circuit 160 deactivates the high-side before it activates the low side to avoid a short-circuit between $V_{IN}$ and ground. When the control circuit 160 deactivates the high-side, the output of the high-side slope control circuit 152 goes low (e.g., logic 0) and the high-side FET 154 turns off. Since the current $I_L$ through the inductor 164 tends to remain unchanged, $V_{SWITCH}$ will become negative relative to ground so that the current $I_L$ can be supplied through the freewheeling diode 166. Current continues to flow through the freewheeling diode 166 until the control circuit 160 activates the low-side. Once the low side becomes activated, the output of the low-side slope control circuit 156 goes high (e.g., logic 1), pulling the gate of the low-side FET 158 higher than the source and turning the low-side FET 158 on. When the low-side FET 158 is on, the source-to-drain input impedance will be low and $V_{SWITCH}$ will be approximately equal to ground. Similar to as described above, the control circuit 160 will deactivate the low-side before reactivating the high-side. Accordingly, the synchronous switching regulator 150 operates to maintain the current flow $I_L$ through the inductor 164, thus maintaining an approximately constant voltage $V_{OUT}$ across a capacitor 168 and a load resistor 170.

It is to be understood that power is lost while the freewheeling diode 166 is conducting current from ground to the node SWITCH. Therefore, the switching regulator 150 loses power at each of the times between activation of the high-side and the low-side. This power loss is represented by the power loss region 20 illustrated in FIG. 1. Accordingly, in accordance with an aspect of the invention, this power loss can be minimized by rapidly increasing the gate voltage of the high-side FET 154 upon activation of the high-side from zero volts to the threshold voltage of the high-side FET 154. Similarly, this power loss can also be minimized by rapidly increasing the gate voltage of the low-side FET 158 upon activation of the low-side from zero volts to the threshold voltage of the low-side FET 158. However, utilizing the high-side slope control circuit 152 and the low-side slope control circuit 156, the activation of the high-side FET 154 and the low-side FET 158 can be accomplished with acceptable levels of EMI emissions while maintaining reduced amounts of power loss resulting from activation of the high-side FET 154 and the low-side FET 158.

It is to be understood that the switching regulator 150 illustrated in FIG. 4 is simplified in that it is not inclusive of all circuit components and supply voltages that may be required for the proper functionality of a typical switching regulator circuit. These components and voltages have been omitted from the discussion of FIG. 4 for the sake of simplicity, as they are not necessary for adequately explaining the functionality of the switching regulator 150 in accordance with an aspect of the invention. FIG. 4 is merely a demonstration that slope control can be utilized for both a high-side and a low-side in accordance with an aspect of the invention.

Figure 5:
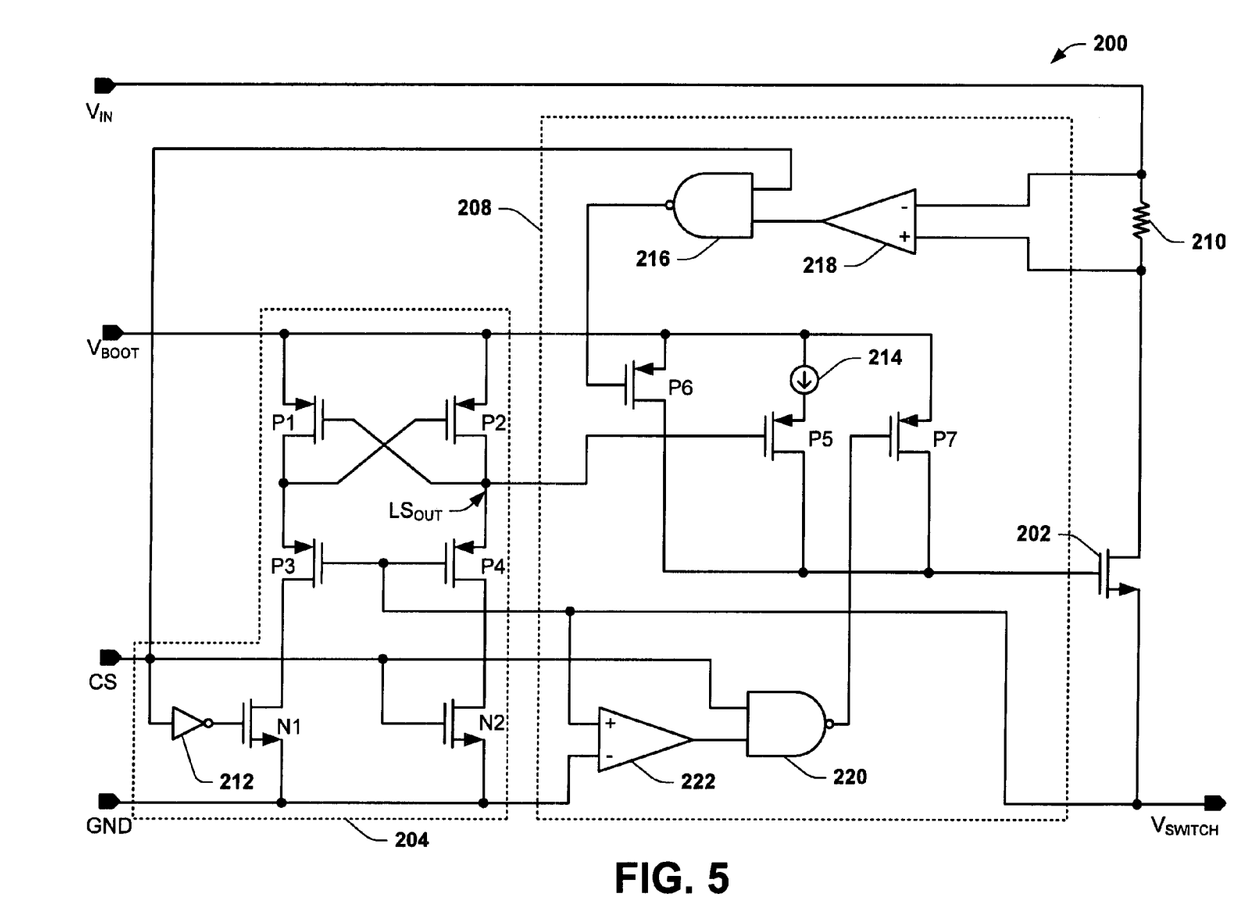
FIG. 5 illustrates a system for driving a high-side FET including an external monitoring slope control circuit in accordance with an aspect of the invention.

FIG. 5 illustrates an example of a system 200 for providing slope control for driving a high-side FET 202 in accordance with an aspect of the invention. The system 200 could be used, for example, in a synchronous switching regulator, such as that described above in FIG. 4, by activating the high-side FET 202 using a control signal CS, such as could be generated from a control circuit (not shown). In the example of FIG. 5, the control signal CS is referenced to a negative supply voltage, illustrated as ground GND, and could be a square wave. It is to be understood that the negative supply voltage need not be ground. The system 200 includes a level shifter circuit 204 and a slope control circuit 208. The slope control circuit 208 includes components that not only change the slope of the gate voltage of the high-side FET 202, but also includes components that sense when the slope of the gate voltage should change. For example, the slope control circuit 208 has components that sense when the rate-of-increase of the gate voltage should change from rapid to slower, such as above the voltage $V_T$ in the slope control region 102 in the example of FIG. 3, and also when the rate-of-increase of the gate voltage should change back to a more rapid rate, such as above the fully activated voltage $V_F$ in the example of FIG. 3. These circuit components all comprise the slope control circuit 208, which could be a single integrated circuit (IC). Alternatively, as demonstrated in FIG. 5, the slope control circuit 208 could be a single IC except for the high-side FET 202 and a current sense resistor 210, which could be a precision resistor, that is interconnected between a drain terminal of the high-side FET 202 and a voltage source $V_{IN}$. Because the high-side FET 202 and the current sense resistor 210 can be configured external to the slope control circuit 208, the slope control circuit 208 can be referred to as an external monitoring slope control circuit.

The level shifter circuit 204 includes two N-type MOSFET switches, N1 and N2. Both the switches N1 and N2 are interconnected between ground GND and the level shifter circuit 204. A source terminal of each are connected to ground GND, a drain terminal of the switch N1 is connected to the drain terminal of a P-type MOSFET switch P3 in the level shifter circuit 204, and a drain terminal of the switch N2 is connected to the drain terminal of a P-type MOSFET switch P4 in the level shifter circuit 204. A gate terminal of the switch N1 is connected to the output of an inverter 212, which operates to invert the control signal CS. A gate terminal of the switch N2 is connected directly to the control signal CS.

The level shifter circuit 204 includes four P-type MOSFET switches, P1, P2, P3, and P4. The switches P1 and P2 each have a source terminal connected to a bootstrap voltage source $V_{BOOT}$. A gate terminal of each of the switches P1 and P2 are connected to a drain terminal of the respective other of the switches P1 and P2. A source terminal of each of the switches P3 and P4 are also connected to the node that includes the drain of the switch P1 and the drain of the switch P2, respectively. A drain terminal of the switch P3 is connected to the drain terminal of N1 in the level shifter circuit 204, and a drain terminal of the switch P4 is connected to the drain terminal of the switch N2 in the level shifter circuit 204. Both the switches P3 and P4 have a gate terminal connected to each other, which is also connected to the source terminal of the high-side FET 202. The source terminal of the high-side FET 202 carries the output signal of the high-side, denoted in FIG. 5 as $V_{SWITCH}$. The output of the level shifter circuit 204 is the node shared by the gate of the switch P1, the drain of the switch P2, and the source of the switch P4, and is denoted in FIG. 5 as $LS_{OUT}$.

The level shifter circuit 204 operates to provide an inverted and adjusted version of the control signal CS to the slope control circuit 208. The level shifter circuit 204 adjusts the control signal CS to a higher voltage reference level for proper activation of the high-side FET 202 referenced to $V_{SWITCH}$. In the example of FIG. 5, the signal $V_{BOOT}$ could be a floating reference voltage that is higher in magnitude than the voltage source $V_{IN}$, and the level shifter circuit 204 outputs an adjusted and inverted control signal at $LS_{OUT}$ for proper activation of the high-side FET 202.

The level shifter circuit 204 and the slope control circuit 208 each receive the control signal CS as an input. When the control signal CS goes high, the switch N2 becomes activated and pulls down the output at node $LS_{OUT}$. The node $LS_{OUT}$ is connected to a gate terminal of a P-type MOSFET switch P5. The switch P5 has a drain terminal connected to a gate terminal of the high-side FET 202 and a source terminal connected to a constant current source 214. The constant current source 214 could be generated from a current mirror, for example, and is represented in the example of FIG. 5 as a constant current source for the sake of simplicity. The constant current source 214 is interconnected between P5 and the bootstrap voltage source $V_{BOOT}$, and is current limited so as to supply a very minimal current, which could have a magnitude measurable in milliamps. Additionally, the constant current source 214 could have a value that is inversely proportional to the transconductance (gm) of the high-side FET 202, such that the rate of change of the high-side FET 202 current is substantially independent of temperature and process variables. When the voltage at $LS_{OUT}$ goes low, P5 turns on, causing the constant current source 214 to apply the minimal amount of current to the gate terminal of the high-side FET 202. The minimal amount of current applied to the gate terminal of the high-side FET 202, when applied as the only current source to the gate, causes the reduction in slope of the gate voltage, such as during the slope control region 102 in the example of FIG. 3, in accordance with an aspect of the invention. It is to be understood that the amount of current generated by the constant current source 214 could be adjustable depending on the amount of slope desired in the slope control region 102 demonstrated in FIG. 3. Such adjustability could result, for example, from modification of the circuit components that constitute the current mirror that comprises the constant current source 214.

At the same time that the switch P5 becomes activated, the control signal CS also drives an input to a NAND gate 216. The NAND gate 216 also receives an input that is an output signal from a current sensing comparator 218. The current sensing comparator 218 receives two inputs, each from opposite terminals of the external current sense resistor 210 (with a negative terminal being connected to the input voltage $V_{IN}$). The output of the NAND gate 216 is coupled to a gate terminal of a P-type MOSFET switch P6. The switch P6 has a source terminal that is connected to the voltage source $V_{BOOT}$ and a drain terminal that is connected to the gate terminal of the high-side FET 202.

The output of the current sensing comparator 218 is high (i.e., logic 1) when there is no difference in voltage on either side of the current sense resistor 210. However, when current flows through the sense resistor 210, there will be voltage drop across the sense resistor 210 which causes the output of the current sensing comparator 218 to go low (i.e., logic 0). Initially, when the control signal CS goes high, the gate voltage of the high-side FET 202 is zero and thus the high-side FET 202 has not yet been activated. Because the high-side FET 202 is not yet activated, no current is flowing through the current sense resistor 210. The output of the current sensing comparator 218 is thus high, so the output of the NAND gate, with a high input from the control signal CS and a high input from the current sensing comparator 218, is low. In this way, the switch P6 activates at substantially the same time that the control signal CS originally goes high. When the switch P6 is activated, the voltage source $V_{BOOT}$ becomes short-circuited with the gate terminal of the high-side FET 202, causing the gate voltage of the high-side FET 202 to increase rapidly and causing the high-side FET 202 to activate once the gate voltage reaches the threshold voltage $V_T$. This rapid increase of the gate voltage reduces power losses that could be caused by a low-side device supplying current to an output node of the high-side FET 202, such as a freewheeling diode conducting current from ground to the output of the high-side $V_{SWITCH}$, as described in the switching regulator of FIG. 4. In the example of FIG. 5, it is to be understood that the switch P5 and the switch P6 open at substantially the same time. However, the difference in current flow from the voltage source $V_{BOOT}$ through the switch P6 and from the constant current source 214 is substantial, with the current flow from the voltage source $V_{BOOT}$ through the switch P6 being significantly higher.

Current begins to flow through the sense resistor 210 at substantially the same time that the high-side FET 202 becomes activated, upon the gate voltage reaching the threshold voltage $V_T$. As described above, when current flows through the current sense resistor 210, the output of the current sensing comparator 218 goes low. This causes the output of the NAND gate 216 to go high, thus shutting off the switch P6. This creates an open circuit between the voltage source $V_{BOOT}$ and the gate terminal of the high-side FET 202. At this point, after the switch P6 has been shut off, only the switch P5 is activated, and a very minimal amount of current is being supplied to the gate terminal of the high-side FET 202 from the constant current source 214, resulting in a reduced rate-of-increase of the gate voltage of the high-side FET 202 after the high-side FET 202 has become activated. Therefore, the current sensing comparator 218 operates to monitor the gate voltage of the high-side FET 202 by deactivating the switch P6 once the gate voltage of the high-side FET 202 reaches the threshold voltage $V_T$, thus reducing the slope of the gate voltage of the high-side FET 202. This reduction in slope of the gate voltage lowers unacceptable EMI emissions caused by rapid input current upon activation of the high-side FET 202.

A NAND gate 220 receives the control signal CS as an input, as well as receiving an output signal from a ground cross comparator 222. The output of the NAND gate 220 is coupled to a gate terminal of a P-type MOSFET switch P7. The switch P7 has a source terminal that is connected to the voltage source $V_{BOOT}$ and a drain terminal that is connected to the gate terminal of the high-side FET 202. The ground cross comparator 222 receives an input at a negative terminal from ground GND and at a positive terminal from the high-side output $V_{SWITCH}$.

In a synchronous switching regulator, such as that described above with reference to FIG. 4, when the high-side FET is not activated, the freewheeling diode is conducting current from ground. The voltage level at the output of the high-side FET is thus negative relative to ground while the freewheeling diode is conducting current. The voltage level at the output of the high-side FET becomes positive upon the high-side FET being fully activated, which is substantially the same time that the freewheeling diode is no longer conducting any current from ground. In the example of FIG. 5, the voltage level at $V_{SWITCH}$ is therefore negative relative to ground while the high-side FET 202 is not yet fully activated, and thus the gate voltage has not yet reached the fully activated voltage $V_F$. The ground cross comparator 222 operates to monitor the voltage of the high-side output $V_{SWITCH}$ to determine when it is positive with respect to ground GND. While the voltage $V_{SWITCH}$ is negative, the output of the ground cross comparator 222 is low. However, upon the voltage $V_{SWITCH}$ reaching a level above zero, the output of the ground cross comparator 222 goes high.

Accordingly, at a time before the gate voltage of the high-side FET 202 reaches the threshold voltage $V_T$, the control signal CS is high and the output of the ground cross comparator 222 is low, causing the output of the NAND gate 220 to be high. The switch P7 is thus open-circuited. Upon the gate voltage being substantially equal to the threshold voltage $V_T$, the high-side FET 202 is slowly activated, and current begins to flow through the high-side FET 202. This causes the negative voltage at $V_{SWITCH}$ to slowly increase toward zero. At a time that the voltage at $V_{SWITCH}$ becomes greater than zero, the gate voltage of the high-side FET 202 substantially equals the fully activated voltage $V_F$, and the high-side FET 202 is fully activated. The output of the ground cross comparator 222 thus goes high, causing the output of the NAND gate 220 to go low. This activates the switch P7, causing the gate terminal of the high-side FET 202 to become short-circuited with the voltage source $V_{BOOT}$. Thus, the slope of the gate voltage of the high-side FET 202 returns to a substantially more rapid rate-of-increase at a voltage level higher than the fully activated voltage $V_F$, such as above the slope control region 102 in the example of FIG. 3, to the maximum voltage $V_{MAX}$. In this way, the ground cross comparator 222 monitors the gate voltage of the high-side FET 202 and detects when the high-side FET 202 has become fully activated, therefore adjusting the slope of the gate voltage to reduce conductive power losses caused by higher levels of resistance $R_{DSon}$.

It is to be understood that other or additional circuit components could be used for the activation of the high-side FET 202, as well as for the sensing of the threshold voltage $V_T$ and the fully activated voltage $V_F$. For example, P-type MOSFET switches can be used in place of N-type MOSFET switches, and vice versa.

Figure 6:
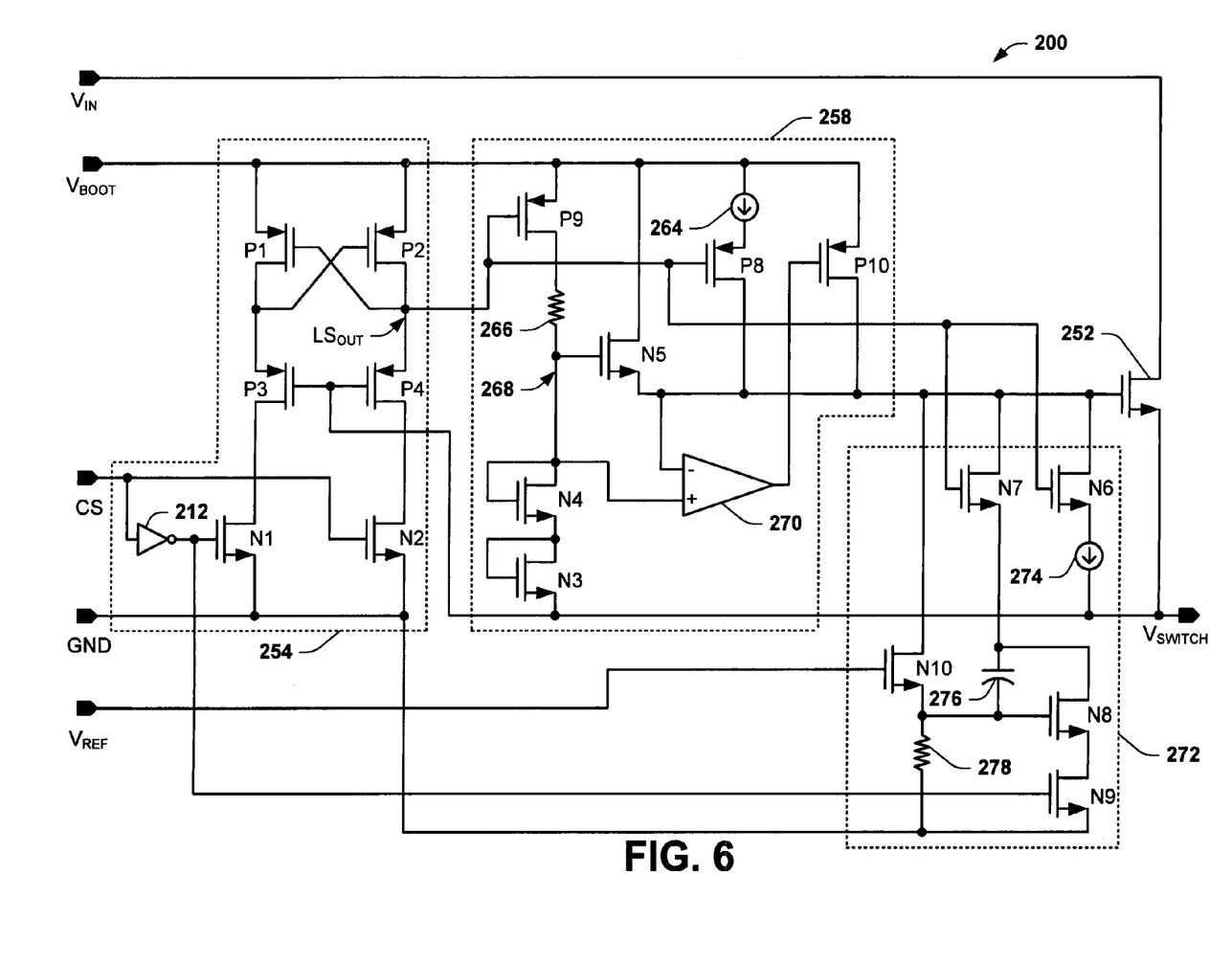
FIG. 6 illustrates a system for driving a high-side FET including an internal monitoring positive slope control circuit and negative slope control circuit in accordance with an aspect of the invention.

FIG. 6 illustrates another example of a system 250 for providing slope control for driving a high-side FET 252 in accordance with an aspect of the invention. The system 250 could be used, for example, in a synchronous switching regulator, such as that described above in FIG. 4, by activating the high-side FET 252 using a control signal CS, such as could be generated from a control circuit (not shown). In the example of FIG. 6, the control signal CS is referenced to a negative supply voltage, illustrated as ground GND, and could be a square wave. It is to be understood that the negative supply voltage need not be ground. The system 250 includes a level shifter circuit 254, a level shifter circuit 254, and a slope control circuit 258. The slope control circuit 258 includes components that not only change the slope of the gate voltage of the high-side FET 252, but also includes components that sense when the slope of the gate voltage should change. For example, the slope control circuit 258 has components that sense when the rate-of-increase of the gate voltage should change from rapid to slow, such as above voltage $V_T$ in the slope control region 102 in the example of FIG. 3, and also when the rate-of-increase of the gate voltage should change back to a more rapid rate, such as above the fully activated voltage $V_F$ in the example of FIG. 3. These circuit components, including the high-side FET 252, are all contained within the slope control circuit 258, which could be a single integrated circuit (IC). Because the high-side FET 252 and all of the circuit components for sensing the slope transitional points of the gate voltage of the high-side FET 252 can be contained within a single package, the slope control circuit 258 can be referred to as an internal monitoring slope control circuit.

The level shifter circuit 254 in the example of FIG. 6 is substantially identical to that described above in the example of FIG. 5. Accordingly, like reference numbers and switch numbers are used to describe the circuit components within, and there is no further discussion of how they operate in the example of FIG. 6.

The level shifter circuit 254 and the slope control circuit 258 each receive the control signal CS as an input. When the control signal CS goes high, the switch N2 becomes activated and pulls down the output at node $LS_{OUT}$. The node $LS_{OUT}$ is connected to a gate terminal of a P-type MOSFET switch P8. The switch P8 has a drain terminal connected to a gate terminal of the high-side FET 252 and a source terminal connected to a constant current source 264. The constant current source 264 could be generated from a current mirror, for example, and is represented in the example of FIG. 6 as a constant current source for the sake of simplicity. The constant current source 264 is interconnected between P8 and the bootstrap voltage source $V_{BOOT}$, and is current limited so as to supply a very minimal current, which could have a magnitude measurable in milliamps. Additionally, the constant current source 264 could have a value that is inversely proportional to the transconductance (gm) of the high-side FET 202, such that the rate of change of the high-side FET 202 current is substantially independent of temperature and process variables. When the voltage at $LS_{OUT}$ goes low, P8 turns on, causing the constant current source 264 to apply the minimal amount of current to the gate terminal of the high-side FET 252. The minimal amount of current applied to the gate terminal of the high-side FET 252, when applied as the only current source to the gate, causes the reduction in slope of the gate voltage, such as during the slope control region 102 in the example of FIG. 3, in accordance with an aspect of the invention. It is to be understood that the amount of current generated by the constant current source 264 could be adjustable depending on the amount of slope desired in the slope control region 102 demonstrated in FIG. 3. Such adjustability could result, for example, from modification of the circuit components that constitute the current mirror that comprises the constant current source 264.

The node $LS_{OUT}$ is also connected to a gate terminal of a P-type MOSFET switch P9. Thus, at the same time that the switch P8 activates upon the output at the node $LS_{OUT}$ going low, the switch P9 also activates. The switch P9 has a source terminal that is connected to the voltage source $V_{BOOT}$ and a drain terminal that is connected to a resistor 266. A pair of N-type MOSFETs N3 and N4 are coupled between the resistor 266 and the output of the high-side $V_{SWITCH}$. The FET N3 has a source terminal connected to the output of the high-side $V_{SWITCH}$ and has a gate terminal and a drain terminal both connected to a source terminal of the switch N4. The FET N4 has a gate terminal and a drain terminal both connected to a node 268. It is to be understood that the FETs N3 and N4, by being configured such that the gate terminal of each is connected with its own respective drain terminal, are each always activated. Accordingly, each of the FETs N3 and N4 have a gate-source voltage $V_{GS}$ equal to a respective drain-source voltage $V_{DS}$, which is approximately equal to the respective threshold voltage of the FET.

The node 268 connects the gate and drain terminal of the switch N4 with the resistor 266 and a gate terminal of an N-type MOSFET switch N5. The switch N5 has a drain terminal connected to the voltage source $V_{BOOT}$ and a source terminal connected to the gate terminal of the high-side FET 252.

It is to be understood that, in the example of FIG. 6, the internal monitoring slope control circuit 258 utilizes matching devices, which is a system of matched FETs to measure the threshold voltage of the high-side FET 252. In the example of FIG. 6, the three switches N3, N4, and N5 are all matched to the high-side FET 252, in that all four of these N-type MOSFET switches have substantially the same electrical characteristics, including the threshold voltage $V_T$. Therefore, when the switch P9 activates, current flows through the switch P9 and through the resistor 266 into the node 268. Because the switches N3 and N4 are both always on, and because both are matched to the high-side FET 252, the voltage level at the node 268, when the switch P9 is activated, is substantially equal to $2*V_T$.

Upon the switch P9 activating, the voltage level of about $2*V_T$ at the node 268 activates the switch N5 at substantially the same time as the activation of the switches P8 and P9. In this way, the switch N5 activates at substantially the same time that the control signal CS originally goes high. When N5 activates, the voltage source $V_{BOOT}$ becomes short-circuited with the gate terminal of the high-side FET 252, causing the gate voltage of the high-side FET 252 to increase rapidly and causing the high-side FET 252 to activate once the gate voltage reaches the threshold voltage $V_T$. This rapid increase of the gate voltage reduces power losses that could be caused by a low-side device supplying current to an output node of the high-side FET 202, such as a freewheeling diode conducting current from ground to the output of the high-side $V_{SWITCH}$ as described in the voltage switching regulator of FIG. 4. In the example of FIG. 6, it is to be understood that the switch P8 and the switch N5 open at substantially the same time. However, the difference in current flow from the voltage source $V_{BOOT}$ through the switch N5 and from the constant current source 264 is substantial, with the current flow from the voltage source $V_{BOOT}$ through the switch N5 being significantly higher.

Upon the gate voltage of high-side FET 252 becoming substantially equal to, or barely greater than, the threshold voltage $V_T$, the switch N5 shuts off. This is because the voltage level at the node 268 is still substantially equal to $2*V_T$, and thus, when the gate voltage of the high-side FET 252 reaches the threshold voltage $V_T$, the gate-source voltage $V_{GS}$ of the switch N5 becomes less than its threshold voltage $V_T$. At this point, after the switch N5 has been shut off, only the switch P8 is activated, and a very minimal amount of current is being supplied to the gate terminal of the high-side FET 252 from the constant current source 264, resulting in a reduced rate-of-increase of the gate voltage of the high-side FET 252 after the high-side FET 252 has become activated. Therefore, the switch N5 operates as a source-follower to monitor the gate voltage of the high-side FET 252 by deactivating once the gate voltage of the high-side FET 252 reaches the threshold voltage $V_T$, thus reducing the slope of the gate voltage of the high-side FET 252. This reduction in slope of the gate voltage lowers unacceptable EMI emissions caused by rapid input current upon activation of the high-side FET 252.

A comparator 270 has a positive terminal connected to the node 268 and a negative terminal connected to the gate terminal of the high-side FET 252. The comparator 270 has an output coupled to a gate terminal of a P-type MOSFET switch P10, which has a source terminal connected to the voltage source $V_{BOOT}$ and a drain terminal connected to the gate of the high-side 252.

The comparator 270 operates to monitor the gate voltage of the high-side FET 252 to determine when the gate voltage is substantially equal to the voltage at the node 268 ($2*V_T$). While the gate voltage is less than $2*V_T$, the output of the comparator 270 is high. However, upon the gate voltage reaching a level substantially equally to $2*V_T$, the output of the comparator 270 goes low. This activates the switch P10, causing the gate terminal of the high-side FET 252 to become short circuited with the voltage source $V_{BOOT}$. Thus, the slope of the gate voltage of the high-side FET 252 returns to a substantially more rapid rate-of-increase at a voltage level higher than the fully activated voltage $V_F$, such as above the slope control region 102 of FIG. 3, to the maximum voltage $V_{MAX}$. In this way, the comparator 270 monitors the gate voltage of the high-side FET 252 and detects when the high-side FET 252 has become fully activated, therefore adjusting the slope of the gate voltage to reduce power losses caused by higher levels of resistance $R_{DSon}$. It is to be understood that the internal monitoring slope control circuit 258 of FIG. 6 does not detect the point at which the high-side FET 252 becomes fully activated. Instead, the slope control circuit 258 detects an arbitrary fully activated voltage $V_F$ that is substantially equal to twice the threshold voltage $V_T$, such as demonstrated in FIG. 3, which could be sufficient for a determination of when the high-side FET 252 becomes fully activated. Further, by choosing different matched FETs, the threshold voltage $V_T$, and thus the arbitrary fully activated voltage $V_F$, can be adjusted as necessary to suit the application.

It is to be understood that other or additional circuit components could be used for the activation of the high-side FET 252, as well as for sensing the threshold voltage $V_T$ and the fully activated voltage $V_F$. For example, P-type MOSFET switches can be used in place of N-type MOSFET switches, and vice verse. It is further to be understood that elements of the external monitoring slope control circuit of FIG. 5 could be combined with elements of the internal monitoring slope control circuit of FIG. 6 to accurately monitor the slope transition points of the gate voltage of a high-side FET. An example could include combining the matched FETs in the example of FIG. 6 with the ground cross comparator in the example of FIG. 5, such that the matched FETs sense the threshold voltage $V_T$ of the high-side FET while the ground cross comparator senses the fully activated voltage $V_F$ of the high-side FET.

The system 250 also includes a negative slope control circuit 272 in accordance with an aspect of the invention, such that the aforementioned slope control circuit 258 is a positive slope control circuit. The negative slope control circuit 272 operates to dynamically change the rate-of-decrease of the gate voltage of the high-side FET 252 upon the high-side becoming deactivated. When the control signal CS goes low, the switch N2 becomes deactivated and pulls up the output at node $LS_{OUT}$, thus deactivating the positive slope control circuit 258 by supplying a high signal to the switches P8 and P9. However, the node $LS_{OUT}$ is also connected to a gate terminal of an N-type MOSFET switch N6. The switch N6 has a drain terminal connected to a gate terminal of the high-side FET 252 and a source terminal connected to a constant current source 274. The constant current source 274 could be generated from a current mirror, for example, and is represented in the example of FIG. 6 as a constant current source for the sake of simplicity. The constant current source 274 is interconnected between N6 and the output of the high-side $V_{SWITCH}$, and is current limited so as to supply a very minimal current, which could have a magnitude measurable in milliamps. Additionally, the constant current source 274 could have a constant transconductance (gm), such that the minimal current that it supplies is independent of temperature and process variables. When the voltage at $LS_{OUT}$ goes high, N6 turns on, causing the constant current source 274 to supply the minimal amount of current from the gate terminal of the high-side FET 252 to the output of the high-side $V_{SWITCH}$, thus slowly reducing the gate voltage of the high-side FET 252 when applied as the only current source from the gate to the output. It is to be understood that the amount of current generated by the constant current source 274 could be adjustable depending on the amount of negative slope desired in deactivating the high-side FET 252. Such adjustability could result, for example, from modification of the circuit components that constitute the current mirror that comprises the constant current source 274.

The node $LS_{OUT}$ is also connected to a gate terminal of an N-type MOSFET switch N7. Thus, at the same time that the switch N6 activates upon the output at the node $LS_{OUT}$ going high, the switch N7 also activates. The switch N7 has a drain terminal that is connected to the gate of the high-side FET 252 and a source terminal that is connected to a capacitor 276. A series pair of N-type MOSFETs N8 and N9 are also coupled to the source terminal of N7. The transistor N9 has a source terminal connected to ground and has a gate terminal that is connected to the output of inverter 212, such that the gate terminal of N9 is activated upon the control signal CS going low. The transistor N8 has a gate terminal that is connected to the capacitor 276 and to a node that is further connected to a source terminal of an N-type MOSFET N10 and a resistor 278, which could have a substantially high resistance value (e.g., 100 kΩ). The transistor N 10 has a drain terminal connected to the gate terminal of the high-side FET 252 and a gate terminal that receives a voltage source $V_{REF}$, which could be about 5 volts.

The transistors N7, N8, and N9 are shut-off transistors, such that, upon the node $LS_{OUT}$ and the output of the inverter 212 going high, the gate terminal of the high-side FET 252 becomes pulled down to ground, causing a current to flow from the gate of the high-side FET 252 to ground. This causes a rapid reduction of the gate voltage of the high-side FET 252. It is to be understood that the transistor N10 is activated by the voltage source $V_{REF}$, and the arrangement of the transistor N10, the capacitor 276, and the resistor 278 is such that the transistor N8 is activated at the onset of a shut-off of the high-side, but the gate voltage of the transistor N8 is stood off so as to limit the drain-to-source current of the transistor N8, thus protecting the transistors N8 and N9 from damage resulting from overcurrent.

The current will continue to flow from the gate of the high-side FET 252 to ground as long as there is a sufficient current flowing through the high-side FET 252 to sustain an inductor current, such as the current $I_L$ flowing through the inductor 164 in FIG. 4. Once the current flowing through the high-side FET 252 is no longer enough to sustain the inductor current, then the balance of the current is supplied from some other source, such as the freewheeling diode 166 of FIG. 4, because a current flowing through an inductor tends to remain unchanged. For the freewheeling diode to conduct current to the output of the high-side $V_{SWITCH}$ from ground, the voltage at the output of the high-side $V_{SWITCH}$ becomes negative relative to ground. Because of an internal capacitance between the gate terminal and the source terminal of the high-side FET 252, the gate-to-source voltage of the high-side FET 252 will tend to remain constant, such that the gate voltage of the high-side FET 252 will follow the source voltage of the high-side FET 252 as it becomes negative relative to ground. This rapid decrease of the gate voltage of the high-side FET 252 as the source voltage of the high-side FET 252 experiences a rapid negative rate of change thus occurs at about the point at which the high-side FET 252 is becoming deactivated, corresponding approximately to the voltage $V_F$ in the example of FIG. 3.

The rapid decrease of the gate voltage of the high-side FET 252, upon the source voltage of the high-side FET 252 becoming negative relative to ground, causes the gate voltage of the shut-off transistor N8 to also significantly drop (through the transistor N7). The transistor N8 thus deactivates, shutting off rapid current flow from the gate terminal of the high-side FET 252 to ground. The minimal current supplied from the constant voltage supply 274 still flows, however, through the transistor N6 from the gate terminal of the high-side FET 252 the output of the high-side $V_{SWITCH}$. Therefore, the negative slope control circuit 272 reduces the rate-of-decrease of the gate voltage of the high-side FET 252 in accordance with an aspect of the invention to reduce EMI emissions resulting from the rapid reduction of current flow through the high-side FET 252. In the example of FIG. 6, it is to be understood that the transistors N6 and N7 activate at substantially the same time. However, the difference in current flow from the gate terminal of the high-side FET 252 to ground through the transistor N7 and from the constant current source 274 is substantial, with the current flow from the gate terminal of the high-side FET 252 to ground being significantly higher. It is further to be understood that, although the above description of the operation of the negative slope control circuit 272 only demonstrates two rates-of-decrease of the gate voltage of the high-side FET 252, additional circuitry can also be included to add additional rates-of-decrease as warranted by a given application, in accordance with an aspect of the invention. Additionally, although the negative slope control circuit 272 is illustrated only in FIG. 6, it can also be used in conjunction with the external monitoring slope control circuit illustrated in FIG. 5, or could be used by itself, without a positive slope control circuit at all.

Figure 7:
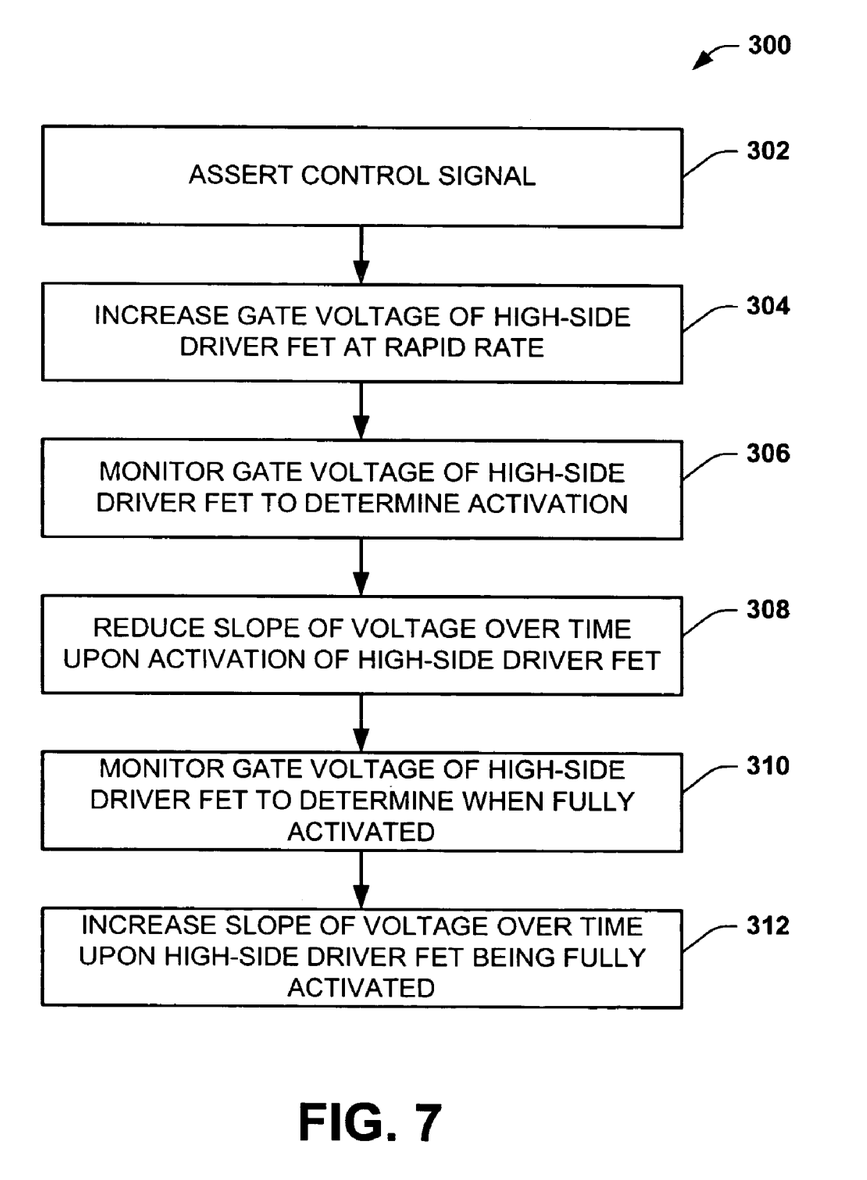
FIG. 7 illustrates a method for driving a power FET in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates a method 300 for activating a power FET in accordance with an aspect of the invention. At 302, a control signal, which could be a square wave or a logic signal, is asserted (i.e., logic 1). This control signal could be routed through a driver circuit and/or a level shifter circuit to adjust the control signal relative to the power FET output. At 304, a gate voltage of the power FET is increased. The increase of the gate voltage could occur at a very rapid rate, or a high slope of gate voltage over time, so as to reduce power losses that could occur from a freewheeling diode supplying current to an output node of the power FET. This could occur through connecting the gate of the power FET with a substantially high voltage source through a switch.

At 306, the method monitors the gate voltage to determine when the gate voltage reaches the threshold voltage $V_T$ of the power FET. This could occur in a slope control circuit through a configuration of additional internal FETs matched with the power FET, or through a current sensing comparator that senses current flow through a sense resistor configured external to the slope control circuit. At 308, upon the method sensing that the gate voltage of the power FET is substantially equal to the threshold voltage $V_T$, the method slows the rate-of-increase of the gate voltage. The method could slow the rate-of-increase by providing an open-circuit from the gate of the power FET to the substantially high voltage source and by supplying a minimal current, such as from a current mirror, to the gate of the power FET. This could reduce EMI emissions to an acceptable level for a switching regulator application.

At 310, the method monitors the gate voltage to determine when the gate voltage reaches the fully activated voltage $V_F$ of the power FET. This could occur in a slope control circuit by using a comparator to measure the point at which the gate voltage of the power FET reaches about twice the threshold voltage $V_T$, or when the voltage at the output of the power FET reaches above zero. At 312, upon the power FET reaching the fully activated voltage $V_F$, the method increases the slope of the gate voltage of the power FET, so as to reduce power losses that could occur from resistance $R_{DSon}$ caused by switching the power FET. This increase of the slope of gate voltage over time could occur by short circuiting the gate of the power FET to the substantially high voltage source.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for driving a power field-effect transistor (FET) comprising:
   a control circuit that generates a control signal to provide a gate voltage of the power FET;
   a slope control circuit coupled between the control circuit and the power FET operative to dynamically control a rate-of-change of a gate voltage of the power FET to reduce electro-magnetic interference (EMI) emissions and power loss resulting from switching the power FET, wherein the slope control circuit comprises a switch interconnecting a gate terminal of the power FET and a current mirror, the current mirror supplying a minimal constant current to reduce a rate-of-change of the gate voltage of the power FET upon the switch being closed.

2. The system of claim 1, wherein the slope control circuit is a positive slope control circuit operative to reduce the rate-of-increase of the gate voltage upon the gate voltage reaching a threshold voltage of the power FET, the slope control circuit also increasing the rate-of-increase of the gate voltage of the power FET upon the power FET being substantially activated.

3. The system of claim 1, wherein the slope control circuit is a negative slope control circuit operative to reduce the rate-of-decrease of the gate voltage upon sensing that the power FET has begun deactivating, the power FET beginning to deactivate upon a source voltage of the power FET experiencing a rapid negative rate of change.

4. The system of claim 1, wherein the minimal constant current has a magnitude that is inversely proportional to a transconductance value of the power FET resulting in a rate of change of a drain-to-source current of the power FET that is independent of process and temperature variations.

5. The system of claim 1, wherein the slope control circuit is further operative to dynamically control the rate-of-change of the gate voltage of the power FET based on at least one environmental factor.

6. The system of claim 5, wherein the slope control circuit comprises a temperature sensor operative to determine an ambient temperature.

7. A system for driving a power field-effect transistor (FET) comprising:
   a control circuit that generates a control signal to provide a gate voltage of the power FET; and
   a slope control circuit coupled between the control circuit and the power FET operative to dynamically control a rate-of-change of a gate voltage of the power FET to reduce electro-magnetic interference (EMI) emissions and power loss resulting from switching the power FET, wherein the slope control circuit comprises a sensing circuit operative to sense a current flow through the power FET to determine that the power FET has become activated, the sensing circuit comprising a current sensing resistor and a comparator, the comparator being operative to sense the current flow through the power FET by sensing a voltage differential of a first terminal of the current sensing resistor relative to a second terminal of the current sensing resistor.

8. The system of claim 7, wherein the external sensing circuit comprises a ground cross comparator operative to activate a switch for increasing a rate-of-increase of the gate voltage of the power FET upon sensing that the power FET is substantially activated, the power FET being substantially activated upon a source voltage of the power FET being positive relative to a negative supply voltage.

9. The system of claim 1, wherein the power FET and the slope control circuit are contained within a single integrated circuit (IC) that comprises a sensing circuit operative to sense that the power FET has become activated.

10. A system for driving a power field-effect transistor (FET) comprising:
 a control circuit that generates a control signal to provide a gate voltage of the power FET;
 a slope control circuit coupled between the control circuit and the power FET operative to dynamically control a rate-of-change of a gate voltage of the power FET to reduce electro-magnetic interference (EMI) emissions and power loss resulting from switching the power FET,
 wherein the power FET and the slope control circuit are contained within a single integrated circuit (IC) that comprises a sensing circuit operative to sense that the power FET has become activated and wherein the sensing circuit comprises a plurality of matched FETs, the matched FETs being substantially identical in electrical characteristics to the power FET.

11. The system of claim 10, wherein the plurality of matched FETs comprises two reference FETs arranged to provide a reference voltage that is about twice a threshold voltage of the power FET.

12. The system of claim 11, wherein the sensing circuit further comprises a comparator operative to increase a rate-of-increase of the gate voltage of the power FET upon the gate voltage of the power FET reaching the reference voltage.

13. The system of claim 10, wherein the plurality of matched FETs comprises a source-follower FET operative to determine when the gate voltage of the power FET has reached a threshold voltage.

14. The system of claim 10, wherein the sensing circuit further comprises a ground cross comparator operative to activate a switch for increasing a rate-of-increase of the gate voltage of the power FET upon sensing that the power FET is substantially activated, the power FET being substantially activated upon a source voltage of the power FET being positive relative to a negative supply voltage.

15. The system of claim 1, wherein the slope control circuit comprises a plurality of shut-off transistors interconnected between the gate terminal of the power FET and a negative supply voltage, the shut-off transistors being operative to increase a rate-of-decrease of the gate voltage of the power FET.

16. The system of claim 15, wherein the slope control circuit deactivates the shut-off transistors upon sensing that the power FET has begun deactivating, the power FET beginning to deactivate upon a source voltage of the power FET becoming negative relative to the negative supply voltage.

17. The system of claim 1, wherein the power FET is one of a high-side FET and a low-side FET.

18. A switching regulator comprising the system of claim 1.

* * * * *